United States Patent [19]
Menegoli

[11] Patent Number: 5,834,826
[45] Date of Patent: Nov. 10, 1998

[54] PROTECTION AGAINST ADVERSE PARASITIC EFFECTS IN JUNCTION-ISOLATED INTEGRATED CIRCUITS

[75] Inventor: Paolo Menegoli, Milpitas, Calif.

[73] Assignee: STMicroelectronics, Inc., Carrollton, Tex.

[21] Appl. No.: 853,143

[22] Filed: May 8, 1997

[51] Int. Cl.$^6$ .............................. H01L 29/00; H01L 23/62
[52] U.S. Cl. ........................ 257/546; 257/500; 257/355
[58] Field of Search .................................. 257/546, 500, 257/355; 326/100

[56] References Cited

U.S. PATENT DOCUMENTS

| | | | |
|---|---|---|---|
| 4,024,417 | 5/1977 | Heuber et al. | 307/303 |
| 4,412,142 | 10/1983 | Ragonese et al. | 307/477 |
| 4,458,158 | 7/1984 | Mayrand | 307/270 |
| 4,466,011 | 8/1984 | Van Zanten | 357/48 |
| 4,819,049 | 4/1989 | Johnston et al. | 357/40 |
| 4,879,584 | 11/1989 | Takagi et al. | 357/43 |
| 4,890,149 | 12/1989 | Bertotti et al. | 357/48 |
| 5,072,278 | 12/1991 | Paparo et al. | 357/43 |
| 5,243,214 | 9/1993 | Sin et al. | 257/372 |
| 5,309,078 | 5/1994 | Cameron | 318/811 |
| 5,491,358 | 2/1996 | Miyata . | |
| 5,495,123 | 2/1996 | Canclini | 257/500 |
| 5,504,402 | 4/1996 | Menegoli | 318/377 |
| 5,514,939 | 5/1996 | Schlager et al. | 318/254 |
| 5,543,650 | 8/1996 | Au et al. . | |

OTHER PUBLICATIONS

Murari et al. (Edgs.), *Smart Power ICs*, (published by Springer–Verlag, 1996), Sec. 1.8, pp. 46–49, and Sec. 5–7, pp. 218–223.

*Primary Examiner*—Stephen Meier
*Attorney, Agent, or Firm*—Theodore E. Galanthay; Lisa K. Jorgenson; Gordon H. Telfer

[57] ABSTRACT

A circuit, and method of operation, allows initial operation of a parasitic transistor in a junction isolated integrated circuit. The initial operation activates elements that produce a turn-on drive signal to a power transistor that has a part in the parasitic transistor, resulting in ending the operation of the parasitic transistor. A low side driver, such as an N channel DMOS, in a bridge circuit for an inductive load is arranged with a sinker region close by so that the sinker region acts as a preferred collector of a parasitic transistor that also includes a region of the low side driver as an emitter. The circuit includes logic that processes signals developed by initial operation of the parasitic transistor to develop the turn-on drive signal to the particular low side driver without affecting other low side drivers in the integrated circuit and before any other devices in the integrated circuit are caused to sink any appreciable current in parasitic transistor operation. When implemented in integrated circuits with a barrier region around the low side driver, the sinker region acting as a preferred collector of the parasitic transistor is in addition to the barrier region and is located within the barrier region more proximate the low side driver.

20 Claims, 3 Drawing Sheets

PROTECTION AGAINST ADVERSE PARASITIC EFFECTS IN JUNCTION-ISOLATED INTEGRATED CIRCUITS

BACKGROUND OF THE INVENTION

1. Field of the Invention

The present invention relates generally to integrated circuits (ICs) with junction isolation and, more particularly, to techniques for avoidance of parasitic effects such as below ground effects in junction-isolated ICs that have power devices, such as DMOS transistors, for driving an inductive load.

2. Description of the Prior Art

Junction-isolated ICs are made with power devices (e.g. handling currents on the order of a few amperes) and also with a number of smaller devices (e.g. in control circuitry) that can be adversely affected by parasitic effects due to the operation of the power devices. ICs to drive motors are frequently of that general nature. The motor coils that are the load of the circuit have a large inductance. The power devices switch current on and off in the respective phases of the coils. Every time one of the devices switches off, the inductance tends to make current continue to flow the same way through the load. When that happens, the outputs of the IC may be driven beyond the power rails (below ground and above the supply voltage) and that can cause harmful effects in other smaller devices in the same IC.

Switching current in the inductive load with junction isolated ICs is known to be subject to parasitic effects, but protection against them remains a serious problem, particularly along with the desire to increase voltages and currents and reduce chip area occupied by a circuit. Parasitic devices occur that are not intended and that allow undesired current flow. A parasitic diode occurs where an N region gets a potential below that of an adjacent P region. A parasitic transistor occurs, for example, where a P region, such as a substrate that is not intended to be active, has two spaced N regions on it with voltages such that NPN transistor action occurs.

Power mosfets, usually made by a technique that gives them a designation as DMOS transistors (where D stands for double-diffused), are important field effect transistors used as power devices in motor drive ICs. They can be made as lateral DMOS devices (LDMOS) or vertical DMOS (VDMOS) devices (often with N-channels). They are examples of devices that can give rise to a problem with parasitics.

The motor driver circuits characteristically have a number of high side drive transistors between a voltage supply and the respective coils of the load and a number of low side transistors between the respective coils and a low, or ground, potential. Each terminal of the load has a high side driver and a low side driver connected with it. When a drive transistor switches off, the inductive load current experiences a "kick". The current tends to be very high or very low depending on whether a high side driver or a low side driver is being turned off. When an upper driver is turned off, the output voltage tends to go low. The output voltage may go very low depending on where the current finds a path. The current that was flowing in the load keeps flowing in the same direction even after the high side driver has been turned off. This situation with extra low voltage after the turn-off of a high side driver is referred to the below-ground effect and it can be quite harmful to other parts of the IC.

Usually a path occurs due to an intrinsic diode, also called a body-drain diode, that is inherent in the way the device transistors are made on the chip. The low side driver connected to the same load terminal as the high side driver that is turned off has such an intrinsic diode, in parallel to its intended current path. There is another diode, the substrate diode, connected from the drain of the low side driver to the substrate. Depending on variations in manufacturing techniques, these two diodes may have different characteristics and result in different performance. The inductive, or recirculating, current can find either or both of two paths, through the intrinsic diode, the substrate diode, or a combination of the two with the current being divided. If the intrinsic diode has a lower series resistance, and a low forward voltage drop when the current flows through it, this would be the preferred path for the current. Alternatively, the substrate diode may have better diode characteristics and take the current.

Conduction in the substrate diode creates added risks because it can form part of a parasitic bipolar, bulk, transistor. Typically, where the driver is an N-channel DMOS on a P substrate, the substrate diode occurs between the DMOS drain, where the output to the load is connected, and the substrate. The parasitic transistor referred to would be an NPN where its emitter is the drain, or output, the base is the substrate, and the collector is any other N diffusion on the substrate. The parasitic collector region can be part of any other passive or active device in the circuit, such as a resistor, capacitor, any kind of transistor, or a diode, including a Zener diode. Frequently, a number of N regions act as a plurality of collectors on the same parasitic transistor and the current is divided according to the substrate resistance to the respective regions.

If the inductive current flow could be confined to the intrinsic diode, the IC could work well. The current would generally be of a manageable low magnitude in that case and current from other devices in the chip would not be affected. That is, if the parasitic transistor is not active, there will not be sinking of current from the other chip devices and they will operate properly. However, commercial fabrication techniques, chip sizes, and geometries often cause at least some current through the parasitic transistor that can create a substantial risk due to below ground effects.

In the prior art, a number of approaches have been taken to avoid or minimize below ground effects. Some approaches involve circuit modifications. For example, one approach is referred to as synchronous rectification, which is to make the low side driver turn on in synchronism with turning off the high side driver. It can be difficult to implement because the drivers' gate signals are normally applied at a gradual slew rate. Great care has to be taken in designing and making a circuit with synchronous rectification to avoid "shoot through". If both the high side driver and low side driver at the same output terminal are on at the same time, even for a very short time, a large current can flow from the power supply to ground without going through the load. That can be very harmful to the IC.

Some other approaches involve changes in the IC structure. For example, a barrier can be made around the low side driver of an N region (on a P substrate) with a conductive connection to P+ regions on the substrate. This makes it more difficult for the NPN parasitic transistor to sink current from other parts of the circuit and helps minimize the below ground effects. Each driver requires such a barrier. Care has to be taken to avoid having the barrier of one low side driver affect other low side drivers due to feedback through substrate contacts. It is not uncommon to have five low side drivers in a chip (e.g. three for the phases of a spindle motor of a disk drive and two for a voice coil motor (VCM) that effects movement of the heads for reading and writing on the magnetic disks). With such numbers, extra complications are encountered to keep the low side drivers, and their respective barriers, adequately spaced from each other in the chip. Barriers may also be limited to low current levels or they will saturate.

Further background information regarding parasitic effects can be found in the published literature including: Murari et al. (Eds.), *Smart Power ICs,* (published by Springer-Verlag, 1996), Sec. 1.8, pp. 46–49, and Sec. 5.7, pp. 218–223; and in U.S. Pat. No. 5,495,123, by Canclini, Feb. 27, 1996.

SUMMARY OF THE INVENTION

The invention, in its various forms, provides new ways to safely limit some parasitic effects in junction isolated ICs. Even when used with highly inductive loads, such as motors, or when the ICs contain numerous power devices along with a considerable number of other devices, or devices are very closely spaced on a chip, ICs with the invention are effective against below ground effects which are generally the most serious effects causing parasitic transistor actions than can be harmful.

The invention provides a combination and method for operation of a drive transistor so that an initial, brief, operation of a parasitic transistor causes the particular driver transistor forming part of that parasitic transistor to be forced on. When the driver is forced on, the parasitic effect is terminated.

One combination in accordance with the invention includes an integrated circuit for driving an inductive load, such as a spindle motor for a disk drive. Each phase of the motor coils making up the inductive load has an output terminal that has a high side drive transistor connected between the output terminal and a high side, or supply, potential and also has a low side drive transistor connected between the output terminal and a low side, or ground, potential. The integration of the drive transistors along with control circuitry, by junction isolation techniques, makes the IC subject to possible below ground effects when the high side drive transistor at an output terminal goes off. Included in the combination is a protection feature that makes sure the parasitic effect is promptly terminated once it begins by forcing on the driver that the parasitic effect involves. For example, the protection feature for the low side driver includes a sinker region and a circuit connected with the sinker region and the gate of the low side driver. Considering examples of N channel DMOS power devices on P substrates, the sinker is an N region, preferably highly doped or N+, that is closely spaced to the power device. The sinker in this protection feature performs differently than barriers previously used to avoid parasitic effects. The sinker may be a region near the power device and does not necessarily enclose it, but a sinker region enclosing the power device is one preferred form. A sinker in accordance with the invention may be used for a low side driver whether the driver also has or does not have a barrier. If there is a barrier for a particular low side driver, the sinker is inside the barrier region near the epitaxial well or tub containing the driver.

With the sinker region close to the power device, a parasitic transistor is created with the DMOS drain (output to the load) as the emitter, the substrate as the base, and the sinker as the collector. N regions farther from the power device are not likely to be collectors. When the transistor starts conducting due to the below-ground effect, the circuit will promptly develop and apply a gate signal to the low side driver that turns it on. Conduction of the low side driver raises the drain voltage from below ground to near ground.

An individual protection feature in accordance with the invention is preferably provided for each low side driver in a chip. It can be important to make sure there is not a condition where turning on one low side driver makes another one go on when it is not necessary. This is a concern, for example, when a motor is tristating. Tristating is a known mode of operation occurring in a spindle motor when the head of the disk drive is parked. During tristating, back EMF rectification occurs and below ground effects are fairly likely to occur. In order to be sure to turn on just the low side driver that has the below ground problem, it is preferred to have a circuit that can only affect that driver.

One form of a circuit for protection against below ground effects has a logic gate. The inputs to the logic gate include information indicating whether a specific sinker near a specific low side driver is involved in parasitic transistor action. An output of the logic gate is connected to the gate of that specific low side driver.

In an example of such a circuit, one input of the logic gate is connected, through a first resistor, in a first circuit branch to ground and the source of the low side driver. That input is also connected in a second circuit branch to a voltage supply through a current mirror, for example of PNP transistors. The collector of one PNP transistor is directly connected at the gate input. The other transistor in the current mirror is connected through a second resistor to the sinker region. The input to the logic gate is high, or "1", only when the parasitic transistor is conducting and a relatively high voltage is across the first resistor. Otherwise, that input is low, or "0".

A second input to the gate is connected to a circuit branch that has a third resistor and ultimately reaches the drain of the power device. In an example where the logic gate is an AND gate, the branch to the second input also includes an inverter. Consequently, that input can be a "1" only when the drain voltage, further reduced by the third resistor, is of a sufficiently low level confirming the below ground effect exists.

When both inputs to the AND gate of the protection circuit are "1", the gate output goes to a high level. The logic gate output is connected to the drive transistor gate and the drive transistor is forced on. Once the drive transistor is on, either or both of the inputs to the gate will go low due to the end of the below ground condition and the drive transistor will be left alone to operate in its normally intended commutation sequence.

The entire time for operation of the protection circuit is very short so that any parasitic effects are slight. Since any parasitic action is essentially confined just to the sinker region, other devices in the chip are not likely to be affected at all.

The output from the logic gate that drives on the low side driver can also be supplied to other circuitry to disable, again just briefly, any parts of the drive system tending to hold the driver in an off condition.

Even though it is preferred to have a sinker and protection circuit for each of the low side drivers, the extra elements that would therefore be included in the IC with the drivers are believed to provide good benefits compared to the extra costs incurred.

The invention provides a way to avoid harmful parasitic effects in ICs with power devices handling relatively high currents by using the parasitic action itself to make the parasitic action stop.

BRIEF DESCRIPTION OF THE DRAWING

FIG. 6 is a schematic diagram of a further example of the invention; an

DESCRIPTION OF PREFERRED EMBODIMENTS

Figure 1:
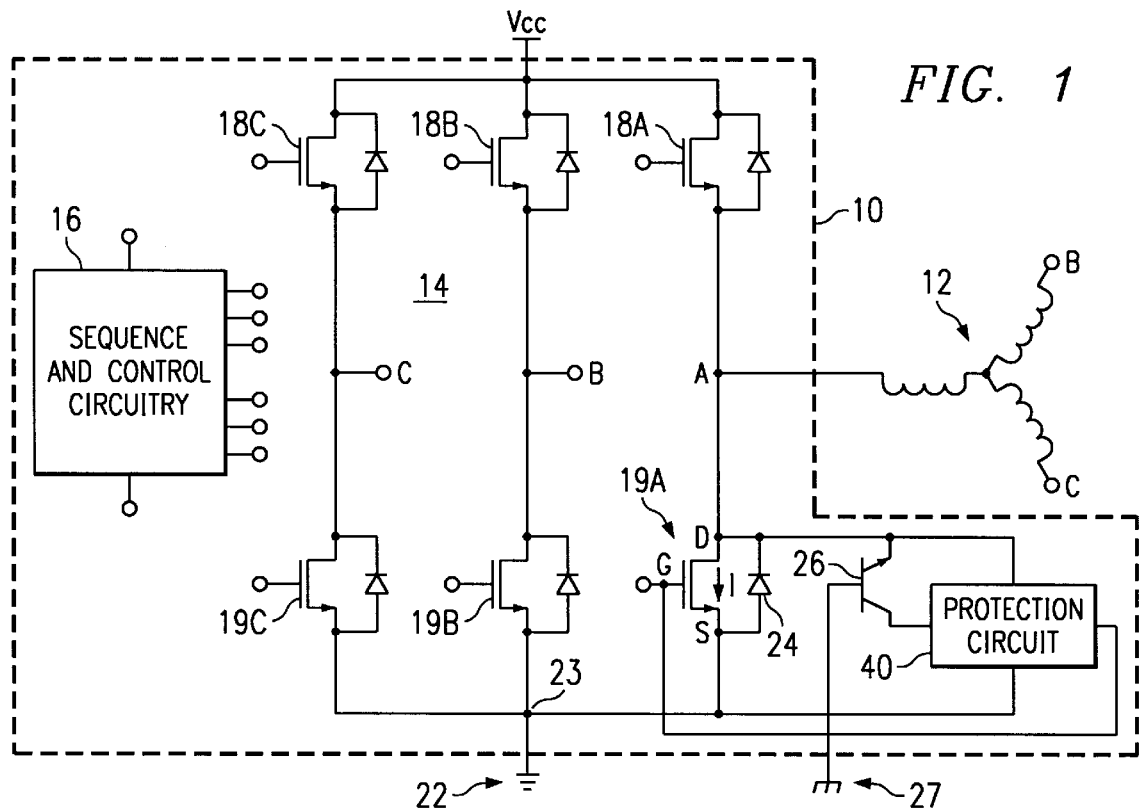
FIG. 1 is a schematic diagram of an integrated circuit with an embodiment of the present invention.

FIG. 1 schematically shows an integrated circuit (IC) 10 that includes elements for driving an inductive load 12 which is a three-phase Y-connected set of coils such as for a brushless motor used as a spindle motor in a disk drive. The IC 10 includes a three phase, full wave, bridge circuit 14 for driving the load 12 and also includes sequence and control circuitry 16 that has elements for sequencing, or commutating, the operation of elements of the bridge circuit to give segments of the load 12 correctly timed currents developed by a supply voltage Vcc. Circuitry 16 typically includes various control loops for operation of the IC 10 as a brushless motor driving circuit, such as a transconductance loop or a phase-locked loop. Circuitry 16 includes what are sometimes referred to as peripheral devices. The bridge circuit 14 has power transistor drivers 18A, 18B, 18C, 19A, 19B, and 19C that draw substantial currents, such as at least a few amperes, compared to relatively lower currents in the circuitry 16.

The circuit 10 of FIG. 1 is an example of an IC in which, when made by known junction isolation techniques, it is desirable to have a way to avoid having parasitic effects caused by operation of the power devices, with an inductive load, adversely affect the operation of other portions of the same IC, such as circuitry 16. Further details of such a circuit 10, and circuitry 16, are known in the art and will not be described in detail.

Conventional features of bridge circuit 14 include having the power transistors, which operate as switches, arranged with a transistor 18A, 18B, or 18C connected between the supply voltage Vcc and a respective output terminal A, B, or C for connection with the load 12. These are sometimes referred to as the high side drivers or upper drivers. The power transistors also include a transistor 19A, 19B, or 19C connected between a respective output terminal A, B, or C and a low voltage point, ground 22. These are sometimes referred to as the low side drivers or lower drivers.

In this example, the power devices 18A–18C and 19A–19C are MOSFETs (Metal Oxide Semiconductor, Field Effect Transistors) made in a known type of structure referred to as DMOS. FIG. 1 shows each of the DMOS devices having a diode connected with its anode connected to the DMOS source contact and its cathode connected to the DMOS drain contact, as shown for lower driver 19A with diode 24 connected between the source S and drain D. The diode 24 is called an intrinsic diode, or a body-drain diode, that occurs as a result of typical IC fabrication techniques.

Further, in this example, each power device is an N channel device and the supply voltage Vcc is a voltage that is positive with respect to ground 22; as shown for transistor 19A, positive current I normally flows from D to S when a sufficient gate voltage is applied to gate terminal G. The construction and operation of the N channel DMOS transistors 18A–18C and 19A–19C may suitably be in accordance well known practice, which gives rise to the parasitic effects discussed in the background above.

As shown in FIG. 1, together with low side driver 19A and its intrinsic diode 24 is shown a bipolar transistor 26 that is a result of the parasitic below-ground effect. The regions in the IC structure that form the parasitic transistor 26 will be discussed in connection with subsequent figures. Also, the nature of a protection circuit 40 as shown in FIG. 1 connected with bipolar transistor 26 and with the low side driver 19A will be further discussed below.

A risk of the below ground effect on lower driver 19A occurs when upper driver 18A connected to the same output A is turned off in its normal commutation. For example, upper driver 18A and lower driver 19B are on during a phase for energizing the coils from terminal A to terminal B, with C left floating. When that path is turned off, current keeps flowing from A to B due to the load inductance if the structure can source that current. The intrinsic diode 24 can be a source of that current and so can a parasitic transistor such as transistor 26. The other low side drivers 19B and 19C, with their respective high side drivers 18B and 18C, are also subject to the below ground effect and the description herein about driver 19A can also be applied to them.

Figure 2:
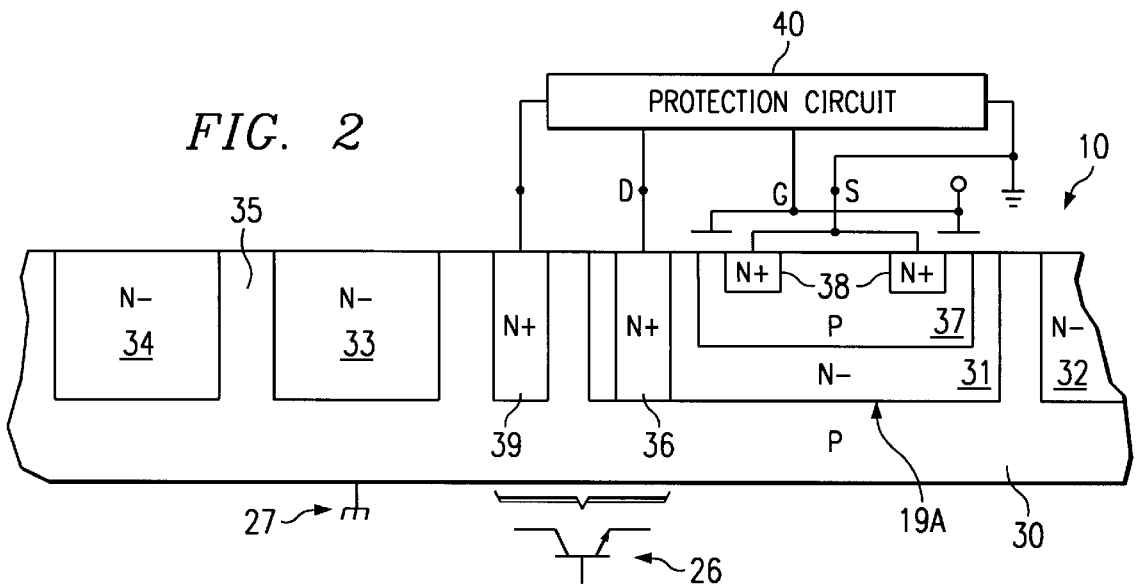
FIG. 2 is a partial cross-sectional view of an integrated circuit showing an embodiment of the invention.

FIG. 2 shows a cross-section of part of an example IC 10 including the structure of a low side driver 19A. A P type substrate 30, after fabrication by known techniques not detailed here, has a number of regions on it such as 31, 32, 33, and 34 of N– material. The regions 31–34 can be formed by epitaxial growth and are sometimes referred to as epi. wells or epi. tubs. The wells or tubs are locations in which individual devices are fabricated, such as epi. well 31 for low side driver 19A. Other devices would normally be in wells 32–34 but are not illustrated here. They may contain any integratable element such as a resistor, capacitor, any type of diode or any type of transistor. The P type material 35 extending to the upper surface of the IC 10 between epi. wells 31–34 forms a PN junction with each well. For example, in the left portion of the structure, N– epi. wells 33 and 34 are separated or isolated by a part of P type material 35 and the devices in those wells are isolated by two back to back PN junctions between 33 and 35 and between 34 and 35. Such junction isolated structures, and their known variations, give rise to the parasitic effects the invention addresses.

In FIG. 2, the structure of low side driver 19A includes an N+ region 36, a P region 37, and one or more N+ regions 38. The N+ region 36 extends vertically through epi. tub 31. It will be recognized that the IC structures shown, including DMOS transistor 19A, are simplified as to shape of regions, are not intended to be drawn to scale, and omit various details. For example, an N+ buried layer may be provided between the bottom of each epi. tub 31–34 and the substrate 30. The N+ region 36 would typically extend down to an N+ buried layer. N+ region 36 is the drain region of power device 19A and has drain contact D.

P region 37 is spaced from N+ region 36 and from the P type substrate by N– type material of tub 31. In region 37 are formed N+ regions 38 that serve as source regions of device 19A with a contact S. A gate contact G is located on an oxide layer, not shown, over a portion of the surface between source regions 38 and drain region 36.

The intrinsic diode 24 shown in FIG. 1 would be formed in the structure of FIG. 2 by P region 37 and N– tub 31 together with drain region 36 and, effectively, connected between source contacts and drain contact D.

Bipolar transistor 26 shown in FIG. 1 is formed in the Ad structure of FIG. 2 by a combination of a normally occurring substrate diode (P substrate 30 and N+ drain 36) with an N+ sinker region 39 located in the P wall material 36 close to the epi. tub 31. Transistor 26 is therefor an NPN transistor with the substrate 30 being the base and drain 36 and sinker 39 serving as respective emitter and collector regions.

The N+ sinker region 39 is preferably made as close to the epi. well 31 as the fabrication technique for the IC permits. For example, known techniques enable locating the sinker region 39 just 3 to 4 microns from the epi. well 31. The sinker region 39 should be closer to epi. well 31 than any other N region so it acts as a preferred collector in the operation of the parasitic transistor 26 and other devices, such as those in epi. wells 32, 33, and 34, are not affected.

Figure 3:
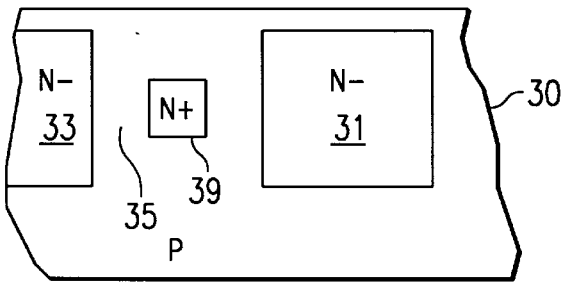
FIG. 3 is a plan view of part of an integrated circuit structure for further illustration of some aspects of the invention.
Figure 7:
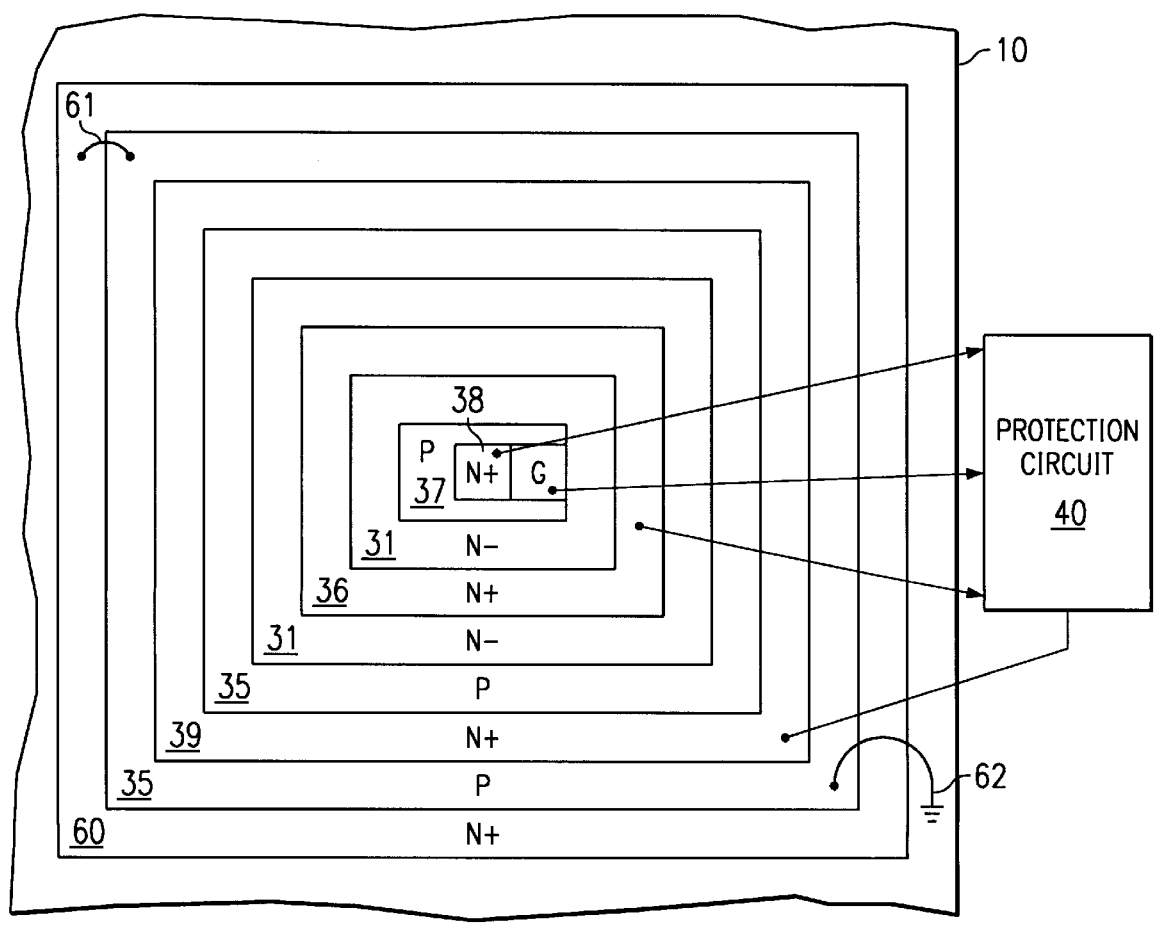
FIG. 7 is a partial plan view of an integrated circuit with a further example of the invention.

The sinker region 39 preferably extends into the IC to the depth of the epi. well 31, and can have any of a variety of surface configurations. In FIG. 3 a plan view of part of an IC like that of FIG. 2 is shown with a sinker region 39 shown near epi. well 31. A DMOS device in epi. well 31 like that of FIG. 2 would be present but is not detailed in FIG. 3. FIG. 3 shows merely a small area for region 39 that is suitable in some applications. In general, it is preferred for region 39 to have a strip configuration or wrap around the area 31. FIG. 7, which will be subsequently described more fully, shows a sinker region in a configuration fully enclosing the tub for a DMOS transistor.

In the present description, transistor 26 is referred to as a "parasitic" transistor because its operation occurs when the below ground effect that gives rise to parasitic transistor action exists. However, it is recognized region 39 is intentionally provided as part of the transistor 26 and not for other functions. Sinker region 39 is a preferred collector of the parasitic transistor 26 because of its proximity to the power device 19A.

FIGS. 1 and 2 show a protection circuit 40 connected to the respective DMOS terminals D, S, and G and to the sinker region 39. The circuit 40 is one that turns on the power device 19A in response to conduction of the parasitic transistor 26.

When a below ground voltage occurs at the DMOS drain D, there is conduction by the parasitic transistor 26 to output terminal A that tends to maintain a current flow in the inductive load in the same direction as occurred when the high side driver 18A was on. The protection circuit 40 detects the conduction of the parasitic transistor 26 and develops a signal applied to the gate G of the power device 19A to turn it on causing the output voltage at D to rise to near or substantially at ground level, as determined by the source to drain resistance in the on state. (Typically, the voltage at D may reach a level slightly below ground.) The inductive load current will be terminated after the energy in the inductor is dissipated. Then the power device is unaffected by the protection circuit and operates in its normal commutation sequence. All of this will occur within a very short time.

FIGS. 1 and 2 show the DMOS source is connected to a circuit ground point 22. Also the IC substrate is shown at a ground potential 27 which may or may not be directly connected to circuit ground 22 as determined in accordance with generally known practice. As is well known, the low side drivers 19A, 19B, and 19C are frequently connected to a ground point through a sense resistor, not shown, as in a control loop for control of the operation of the bridge 14. The invention is advantageous whether such a sense resistor is or is not in the circuit. If a sense resistor is present between the common node 23 of FIG. 1 and ground 22, the protection circuit 40 would be preferably connected, in most applications, to the ground 22 rather than the source contact S. As a general matter, the connection could be made to either point.

Figure 4:
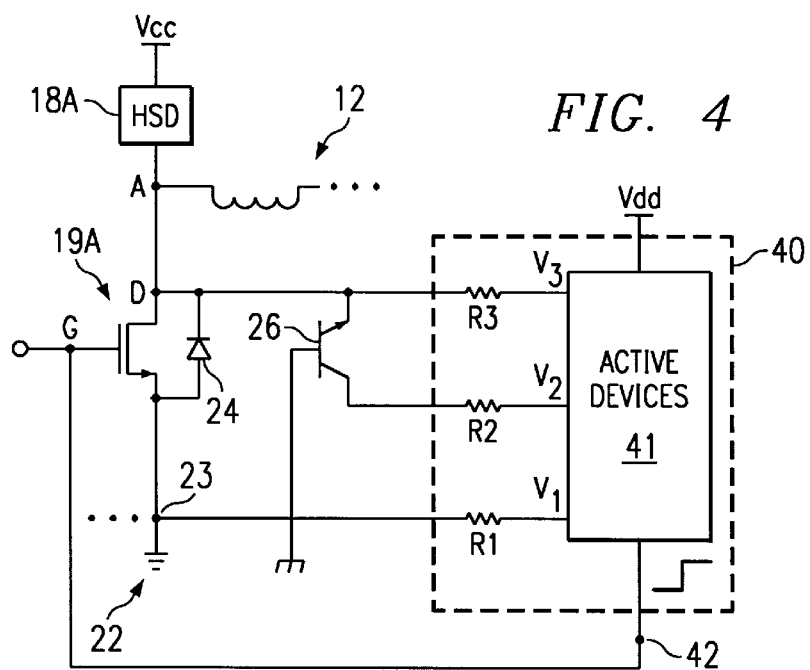
FIG. 4 is a schematic diagram of an embodiment of the invention.

Referring to FIG. 4, a subcircuit showing the low side driver 19A and protection circuit 40 is shown to explain operation of some forms which circuit 40 may take. In this example, circuit 40 includes one or more active devices, collectively shown as 41, which are connected between a supply voltage Vdd and a terminal 42 connected to the gate G of DMOS 19A. The supply voltage Vdd is of a magnitude sufficient to provide a turn on signal to gate G.

To control the application of the turn on signal from circuit 40, the active devices 41 of circuit 40 are connected to the DMOS 19A and the parasitic transistor 26 through resistors R1, R2, and R3. R1 develops a voltage V1 representing a potential difference from the ground 22 (or node 23) across R1. V2 is a voltage developed from the potential on the collector of the parasitic transistor 26, which is the sinker region 39, across resistor R2. V3 is a voltage developed from the potential on the emitter of the parasitic transistor 26, which is the drain of transistor 19A, across resistor R3. The voltages V1, V2, and V3 are applied to the active devices 41 and their relative values determine whether, and when, a gate turn on signal is developed at terminal 42.

When the parasitic transistor 26 goes from off to on, due to a below ground voltage at drain D, the collector and emitter potentials of transistor 26 go from higher to lower levels and the voltages V2 and V3 drop. When V2 and V3 are of predetermined levels that confirm the operation of the transistor 26, the active devices 41 develop the gate turn on signal at terminal 42. This turns on power device 19A and that makes the voltage at the drain D rise so V2 and V3 rise again and the gate signal at terminal 42 ends.

Figure 5:
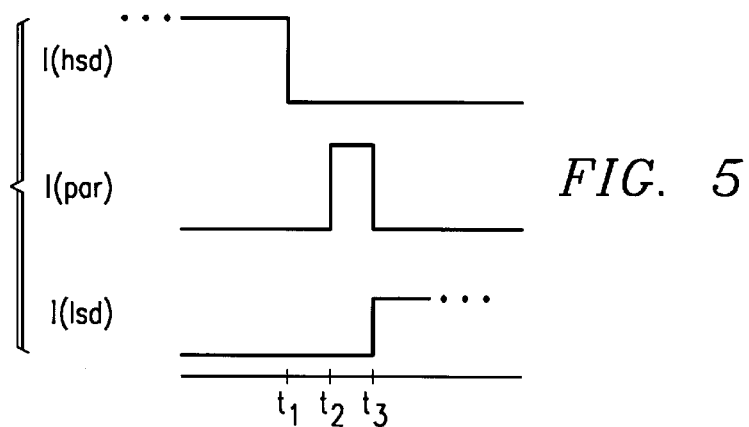
FIG. 5 is a set of current waveforms for illustrating an example of the timing of certain events in the operation of some embodiments.

A method of operation in accordance with the invention will be described with reference to FIG. 4 taken with FIG. 5 which shows some of the timing points of significance. FIG. 5 is simplified, for example, in showing abrupt changes in currents that may instead change somewhat more gradually. For example, the rise in current through the parasitic transistor may be considerably more gradual than illustrated. But FIG. 5 serves to show the sequence of certain events in the operation of FIG. 4.

The high side driver 18A at the same load terminal A as low side driver 19A is turned off, in its normal commutation, at a time t1. This is represented in FIG. 5 by a quick drop in the current I(hsd) through the high side driver 18A(HSD). As is known, the inductive load 12 will continue to draw current from any available source and try to maintain the current (from output A to the right through load 12 in this example) that was flowing when HSD 18A was on. That causes the potential at the drain D to be below ground 22 and forward biases the intrinsic diode 24. It also forward biases the substrate diode formed by the P substrate 30 and N drain region 36 (FIG. 2).

After a certain delay, t2–t1, the parasitic transistor 26 is conducting and its current I(par.) has risen to an appreciable level. This delay will vary due to a number of factors such as the specific doping levels and geometry in the IC, but the effective operation of the invention does not depend on the time it takes for the parasitic transistor action to begin.

A step in the method of operation of the invention is allowing an initial operation of the parasitic transistor 26. The proximity of sinker region 39 to the low side driver 19A makes it a preferred collector facilitating turning on the transistor 26 without appreciable effect on other devices in the IC.

The method further comprises detecting the initial operation of the transistor 26. That can be performed for example, by circuit 40 detecting that the potential difference between V2 and V3 has dropped. Further, the method comprises driving on the power transistor 19A that has its drain region and output terminal involved in the parasitic transistor action. This step is performed promptly after the initial operation of the parasitic transistor.

The power transistor 19A therefore turns on at time t3 due to operation of the protection circuit 40 and it conducts a current I(lsd) between ground and output A. After that, the switching of the low side driver 19A can proceed according to its normal commutation with signals from sequencer and control circuitry (16, FIG. 1). The gate turn on signal from circuit 40 will be only long enough for the voltage at output A to rise sufficiently to terminate the parasitic effect.

Figure 6:
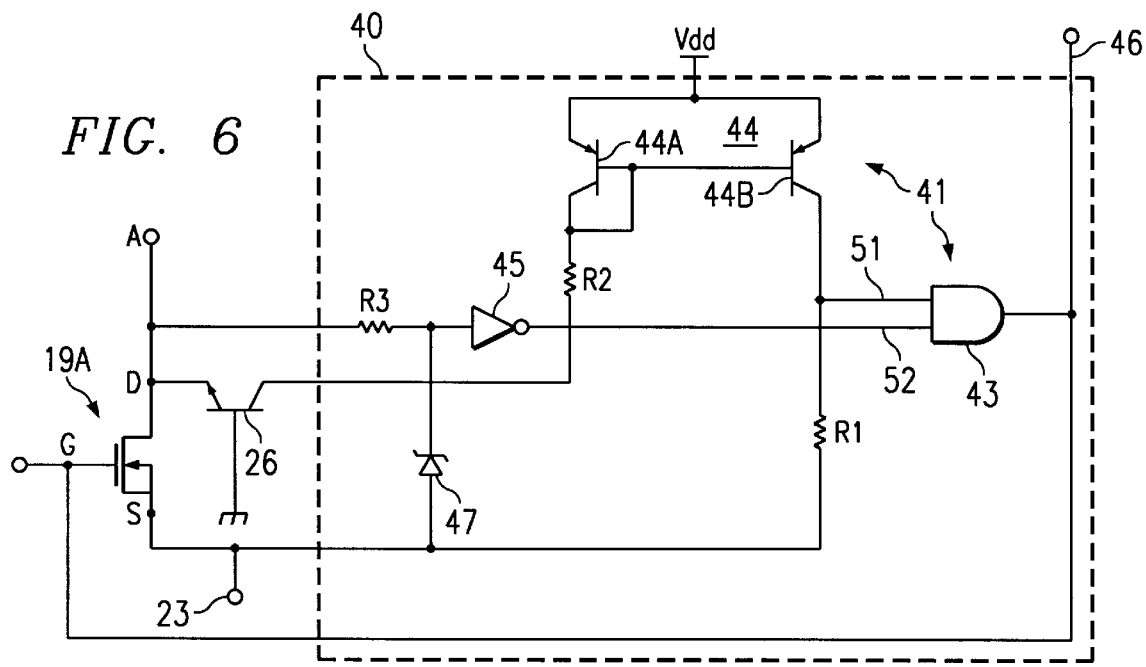

A more detailed example of a protective circuit 40 in combination with a low side driver 19A is shown in FIG. 6. Resistors R1, R2, and R3 are shown each having a first terminal connected respectively to the low side driver 19A or transistor 26 as in FIG. 4. In this example, the source S of the driver 19A, and common node 23, are connected through resistor R1 to one input 51 of a logic gate 43. Gate 43 is an AND gate in this example.

The collector of NPN parasitic transistor 26, sinker region 39, is connected through resistor R2 to a current mirror 44 of two PNP transistors 44A and 44B. The configuration of current mirror 44 is in accordance with known practice; instead of bipolar transistors 44A and 44B, it could alternatively be comprised of P channel MOS transistors.

In this example, bipolar transistors 44A and 44B have their bases interconnected and their emitters are both connected to supply voltage Vdd. The collector of transistor 44A is connected to the base region of 44A. The collector of transistor 44B is connected to the first terminal 51 of gate 43. The parasitic transistor 26 draws current from the N+ sinker region 39 and turns on the mirror 44. That turns the current signal into a voltage signal applied to the gate 43. In relation to FIG. 4, examples of active devices 41 shown there include current mirror 44 and gate 43 in FIG. 6.

When the parasitic transistor is on and the current mirror operates, the gate input 51 goes high or from "0" to a logic "1".

Resistor R3 is in a circuit branch from the drain D and output A to a second input 52 of logic gate 43. For this example, an inverter 45 is in the circuit branch with R3. When the output A and drain D go low, the voltage at input 52 developed across the combination of R3 and inverter 45 goes high, or to a logic "1". When the conditions exist to create a "1" at both of the inputs 51 and 52, the output of gate 43 goes up and provides the gate turn on signal to gate G of power device 19A.

Therefore, the parasitic transistor 26 is used in a manner that is turned off by its own operation.

FIG. 6 shows an example with a Zener diode 47 connected between the low voltage node 23 and the input to inverter 46. The Zener diode is for making sure the voltage at the inverter 45 does not exceed a magnitude that is safe for the structure of the inverter which may, like the other elements of circuit 40, be integrated according to generally known techniques. The circuit 40 may, of course, include additional or varied elements to perform effectively under a particular set of fabrication techniques and voltage or current conditions.

One alternative to the circuit 40 as shown in FIG. 6 would include having a NAND gate instead of AND gate 43. One input of the NAND gate would be connected to a current mirror as in FIG. 6. Another input would be connected to the circuit branch to the output terminal A but in this case an inverter would not be present in that circuit branch.

An arrangement such as that of FIG. 6 operates solely to affect the operation of low side driver 19A. In the condition known as tristating there can be below ground effects at a plurality of low side drivers in the IC. In preferred forms of the invention, a protection feature, comprising a sinker region 39 and a circuit 40, is separately provided for each low side driver. Operation of a protection circuit in accordance with this invention for one driver, such as 19A, will not affect other low side drivers in the IC, which will only be regulated by their own like protection features.

The other low side drivers may include 19B and 19C as shown in FIG. 1 as well as low side drivers of a voice coil motor drive circuit that may be in the same IC.

The invention generally provides a means and method for limiting adverse parasitic effects anywhere in an IC by detecting the occurrence of the parasitic effect and using that detected operation to stop the parasitic effect. Where voltage at an output goes outside the power rails such as due to an inductive load, the action of a parasitic transistor is applied to turn on the related power drive transistor and terminate the parasitic effect.

The application of the invention to low side drivers in bridge circuits for motor control ICs, as described in the above embodiments, is believed to relieve IC designers of major concerns for adverse effects due to below ground effects. Advantages are obtained whether or not there are other features in the IC that also help protect against those adverse effects. Furthermore, there can be advantages through applying the invention to one or more power devices, such as low side drivers, even if other drivers in the same IC are not similarly protected. Protection against below ground effects for low side drivers to avoid harm to devices in the control circuitry of an IC is generally more important than, for example, protecting against parasitics associated with high side drivers in the same IC.

Reference is made to FIG. 7 to show application of the invention with a power device that also is enclosed within a barrier, such as in accordance with U.S. Pat. No. 5,495,123, Feb. 27, 1996, to Canclini, which is herein incorporated by reference for description of such a barrier. In FIG. 7, reference numerals are applied consistent those of FIG. 2 for corresponding elements, although somewhat modified.

In this example, to show a variation from FIGS. 2 and 3 that may be preferably employed regardless of whether a barrier is present, the sinker region 39 extends completely around the epi. tub 31 in which the structure of a low side driver is contained. As previously mentioned, the sinker region can have various configurations so it operates as a preferred collector of a bipolar transistor resulting from the parasitic below ground effects. Enclosing the power device with a sinker region 39 makes even more certain that it will operate as a preferred collector.

A barrier region 60 is also shown. It is an N+ region that may be formed like sinker region 39 except an important characteristic is that sinker region 39 is inside, and more proximate to the epi. well 31 than, the barrier region 60. In this example, barrier region 60 completely surrounds the sinker region 39. The above mentioned patent describes other configurations for barrier region 60 as well. Barrier region 60 has conductive connections on the surface including interconnect 61 from a first location on barrier region 60 to the P type substrate through isolation wall 35 and an interconnect 62 to ground from a second location on isolation wall 35. Contact to the isolation wall 35 is preferably made at P+ region (not shown) in the P type wall. Further information on the nature and operation of such barriers may be found by referring to the above-mentioned patent.

A sinker region and protection circuit in accordance with the present invention can be applied, if desired, to ICs provided with synchronous rectification. That is, the IC would be intended to operate so a low side driver is turned on at the same time its related high side driver is turned off. If the synchronous rectification is working properly the parasitic transistor would not operate. However, in some applications, the arrangement of the invention could be useful as a back-up to synchronous rectification.

Referring again to FIG. 6, there is an additional circuit branch 46 shown at the output of gate 43. This is merely to illustrate that the gate output may be used to affect operation of other parts of the IC, if desired. For example, if there are other parts of the IC tending to hold driver 19A off, when operation of circuit 40 would otherwise force it on, the output on branch 46 can be used to disable, temporarily, those other parts of the IC.

In a circuit like that illustrated in FIG. 6, it may be desirable in some applications to have additional circuitry. For example, if a below ground effect returns right after the driver 19A has been turned on and then goes off, there may be a tendency to have operation of the low side driver oscillate between off and on states. To minimize the probability of that occurring, there may be some additional elements in the IC for compensation or for control of the frequency of any such oscillation. It is believed the present invention can provide substantial benefits in many ICs without such additional elements.

Further variations from the illustrative embodiments described herein can be made by those skilled in the art consistent with the spirit and scope of the invention as hereinafter claimed.

What is claimed is:

1. An integrated circuit arrangement with protection against below ground voltage comprising:
   a power device integrated on a substrate, a part of the power device and the substrate forming a substrate diode;
   a sinker region on the substrate adjacent to and spaced from the power device,
   the sinker region and the substrate diode together forming a parasitic transistor;
   a protective drive circuit connected with the sinker region of the parasitic transistor and with the power device to turn on the power device in response to conduction of the parasitic transistor.

2. The arrangement of claim 1 wherein:
   the power device is a field effect transistor having a source, a drain, and a gate;
   the parasitic transistor is a bipolar transistor having an emitter, a base, and a collector;
   the drain of the field effect transistor forms the emitter of the parasitic transistor;
   the sinker region forms the collector of the parasitic transistor, and the substrate forms the base of the parasitic transistor.

3. The arrangement of claim 1 wherein:
   the power device is a low side driver connected between an output terminal to an inductive load and a low side potential;
   said integrated circuit arrangement further comprising a high side driver power device connected between the output terminal and a high side potential;
   said parasitic transistor and said protective drive circuit cooperating to minimize time the drain of the low side driver can be below the low side potential when the high side driver power device is turned off.

4. The arrangement of claim 3 wherein:
   the low side driver and the high side driver are parts of a bridge for supplying power to the load.

5. The arrangement of claim 3 wherein:
   the substrate has a plurality of other circuit devices integrated on it and the sinker region is arranged to provide parasitic transistor action, resulting from the drain of the low side driver being driven before the low side potential, without appreciable effect on the other circuit devices.

6. The arrangement of claim 5 further comprising:
   a barrier comprising at least one barrier region forming a PN junction on the substrate near the power device, a direct conductive connection to the substrate between a first part of the at least one barrier region and a first portion of the substrate nearer the power device, and wherein
   the sinker region to which the protective drive circuit is connected is located between the at least one barrier region and the power device.

7. The arrangement of claim 6 wherein:
   said barrier further comprises a direct conductive connection between a second portion of the substrate within the barrier region and the low side potential.

8. The arrangement of claim 2 wherein:
   the power device is an N channel DMOS device and the parasitic transistor is an NPN transistor.

9. The arrangement of claim 1 wherein:
   the protective drive circuit comprises a logic gate that provides a turn-on signal to the power device in response to conduction of the parasitic transistor.

10. An integrated motor driver circuit comprising:
    a plurality of power devices on a single substrate, connected in a bridge circuit for driving motor coils, each power device being a DMOS device having a source, a drain, and a gate;
    the plurality of power devices including a plurality of high side drivers and a plurality of low side drivers, the high side drivers connected between a high voltage supply and respective load terminals and the low side drivers connected between a low, ground, voltage point, at their sources and the respective load terminals at their drains;
    each low side driver having a protection against voltage driven below the low, ground voltage point comprising a sinker region near the low side driver and forming a parasitic transistor in which the sinker region is the collector, the substrate is the base, and the drain of the low side driver is the collector with the parasitic transistor connected in a protection circuit arranged so that the low side driver is turned on in response to conduction of the parasitic transistor.

11. The integrated motor driver circuit of claim 10 wherein:

the protection circuit of each low side driver comprises logic arranged to produce an output so that the low side driver is turned on without affect on others of the plurality of low side drivers in the integrated motor driver circuit.

12. The integrated motor driver circuit of claim 10 wherein:

the protection circuit of each low side driver circuit comprises a logic gate having a pair of input terminals, including a first of the pair of input terminals connected through a first resistor to the low voltage point and also connected through a current mirror to a voltage supply, said current mirror including a first mirror transistor connected to the first input and a second mirror transistor connected to the sinker, collector, region of the parasitic transistor through a second resistor, a second of the pair of input terminals connected through a third resistor to the drain, emitter, region of the parasitic transistor.

13. A method of operating to provide protection against parasitic transistor action in integrated circuits having, on a single substrate, high and low side power transistors for driving an inductive load, comprising the steps of:

allowing an initial operation of the parasitic transistor; detecting the initial operation of the parasitic transistor; and driving on the power transistor that is involved in the parasitic transistor promptly after detecting the initial operation of the parasitic transistor thereby resulting in terminating the operation of the parasitic transistor.

14. A method in accordance with claim 13 wherein:

the step of allowing an initial operation of the parasitic transistor is performed in a manner including using a region on the substrate proximate a low side power transistor as a preferred collector region of the parasitic transistor, and creating a current in a circuit connected with the preferred collector region;

the step of detecting the initial operation of the parasitic transistor is performed in a manner including having the circuit connected with the preferred collector region establishing certain predetermined voltages at certain circuit points due to operation of the parasitic transistor; and the step of driving on the power transistor is performed in a manner including applying to a control terminal of the low side power transistor involved in the parasitic transistor a drive signal in response to the predetermined voltages established at said certain circuit points.

15. A method in accordance with claim 14 wherein:

the step of applying a drive signal to the power transistor involved in the parasitic transistor is performed without affect on others of the power transistors on the same substrate.

16. An integrated circuit, for drive control of an inductive load, including on a single substrate a plurality of power transistors and a plurality of control circuit devices with junction isolation between parts of the integrated circuit whereby one of the power transistors is susceptible to having its output to the load being drawn beyond a predetermined applied voltage due to inductive current flow when another one of the power transistors is turned off, with a protection feature comprising:

a circuit arranged for allowing initial operation of a parasitic transistor of which the one power transistor forms a part, detecting that initial operation, and producing a turn on drive signal to turn on the one power transistor promptly after detecting the initial operation of the parasitic transistor.

17. The integrated circuit of claim 16 wherein:

the one power transistor is a low side driver of a bridge that includes a plurality of high side drivers and low side drivers.

18. The integrated circuit of claim 17 wherein:

the low side driver is a DMOS transistor and its drain becomes the emitter of the parasitic transistor under the stated conditions.

19. The integrated circuit of claim 18 wherein:

a sinker region is provided in the substrate proximate the low side driver and the sinker region becomes the collector of the parasitic transistor under the stated conditions.

20. The integrated circuit of claim 18 wherein:

a part of the circuit for detecting initial operation of the parasitic transistor and producing a turn on drive signal includes circuit elements connected with the drain and sinker regions to develop predetermined voltages when operation of the parasitic transistor occurs.

* * * * *

UNITED STATES PATENT AND TRADEMARK OFFICE

CERTIFICATE OF CORRECTION

PATENT NO.    :    5,834,826

DATED         :    November 10, 1998

INVENTOR(S)   :    Paolo Menegoli

It is certified that error appears in the above-identified patent and that said Letters Patent is hereby corrected as shown below:

Column 1, line 64, after "to" insert --as--.

Column 7, line 7, delete "Ad".

Column 7, line 10, delete "36" and substitute --35--.

Column 7, line 11, delete "therefor" and substitute --therefore--.

Column 11, line 13, delete "region" and substitute --regions--.

Column 12, line 25, delete "before" and substitute --below--.

Column 12, line 67, delete "collector" and substitute --emitter--.

Signed and Sealed this

Thirtieth Day of March, 1999

Attest:

Q. TODD DICKINSON

*Attesting Officer*    *Acting Commissioner of Patents and Trademarks*